US006707098B2

(12) United States Patent
Hofmann et al.

(10) Patent No.: US 6,707,098 B2
(45) Date of Patent: Mar. 16, 2004

(54) ELECTRONIC DEVICE AND METHOD FOR FABRICATING AN ELECTRONIC DEVICE

(75) Inventors: Franz Hofmann, Munich (DE); Franz Kreupl, Munich (DE); Richard Johannes Luyken, Munich (DE); Till Schloesser, Dresden (DE)

(73) Assignee: Infineon Technologies, AG (DE)

( * ) Notice: Subject to any disclaimer, the term of this patent is extended or adjusted under 35 U.S.C. 154(b) by 0 days.

(21) Appl. No.: 09/882,882

(22) Filed: Jun. 15, 2001

(65) Prior Publication Data

US 2002/0153160 A1 Oct. 24, 2002

(30) Foreign Application Priority Data

Jul. 4, 2000 (DE) .......................... 100 32 413

(51) Int. Cl.⁷ .............................................. H01L 29/792
(52) U.S. Cl. ...................... 257/324; 257/12; 257/27; 257/30; 257/315; 438/962
(58) Field of Search ................... 257/9, 12, 27, 257/30, 314, 315, 324, 321; 438/962

(56) References Cited

U.S. PATENT DOCUMENTS

| | | | |
|---|---|---|---|
| 6,069,380 A | * | 5/2000 | Chou et al. .............. 257/315 |
| 6,128,214 A | * | 10/2000 | Kuekes et al. ........... 365/151 |
| 6,472,705 B1 | * | 10/2002 | Bethune et al. ......... 257/314 |
| 6,487,112 B1 | * | 11/2002 | Wasshuber ............... 365/163 |
| 6,548,825 B1 | * | 4/2003 | Yoshii et al. ............. 257/24 |

FOREIGN PATENT DOCUMENTS

WO   WO 01/03208   1/2001

OTHER PUBLICATIONS

C. Dekker, Carbon–Nanotubes as Molecular Quantum Wires, Physics Today, pp. 22–28, May 1999.
Jung Sang Suh and Jin Seung Lee, Highly–Ordered Two–Dimensional Carbon–Nanotube Arrays, Applied Physics Letters, vol. 75, No. 14, pp. 2047–2049, Oct. 1999.
Ilgweon Kim et al, Room Temperature Single Electron Effects in Si Quantum Dot Memory with Oxide–Nitride Tunneling Dielectrics, IEDM 98, pp. 111–114, 1998.
S. Aritome et al, Reliability Issues of Flash Memory Cells, Proceedings of the IEEE, vol. 81, No. 5, pp. 776–788, May 1993.

* cited by examiner

Primary Examiner—B. William Baumeister
(74) Attorney, Agent, or Firm—Jeffrey R. Stone; Briggs and Morgan, P.A.

(57) ABSTRACT

An electronic device has a plurality of electrically conductive first nanowires, a layer system applied on the first nanowires, and also second nanowires applied on the layer system. The first and second nanowires are arranged skew with respect to one another. The layer system is set up in such a way that charge carriers generated by the nanowires can be stored in the layer system.

18 Claims, 3 Drawing Sheets

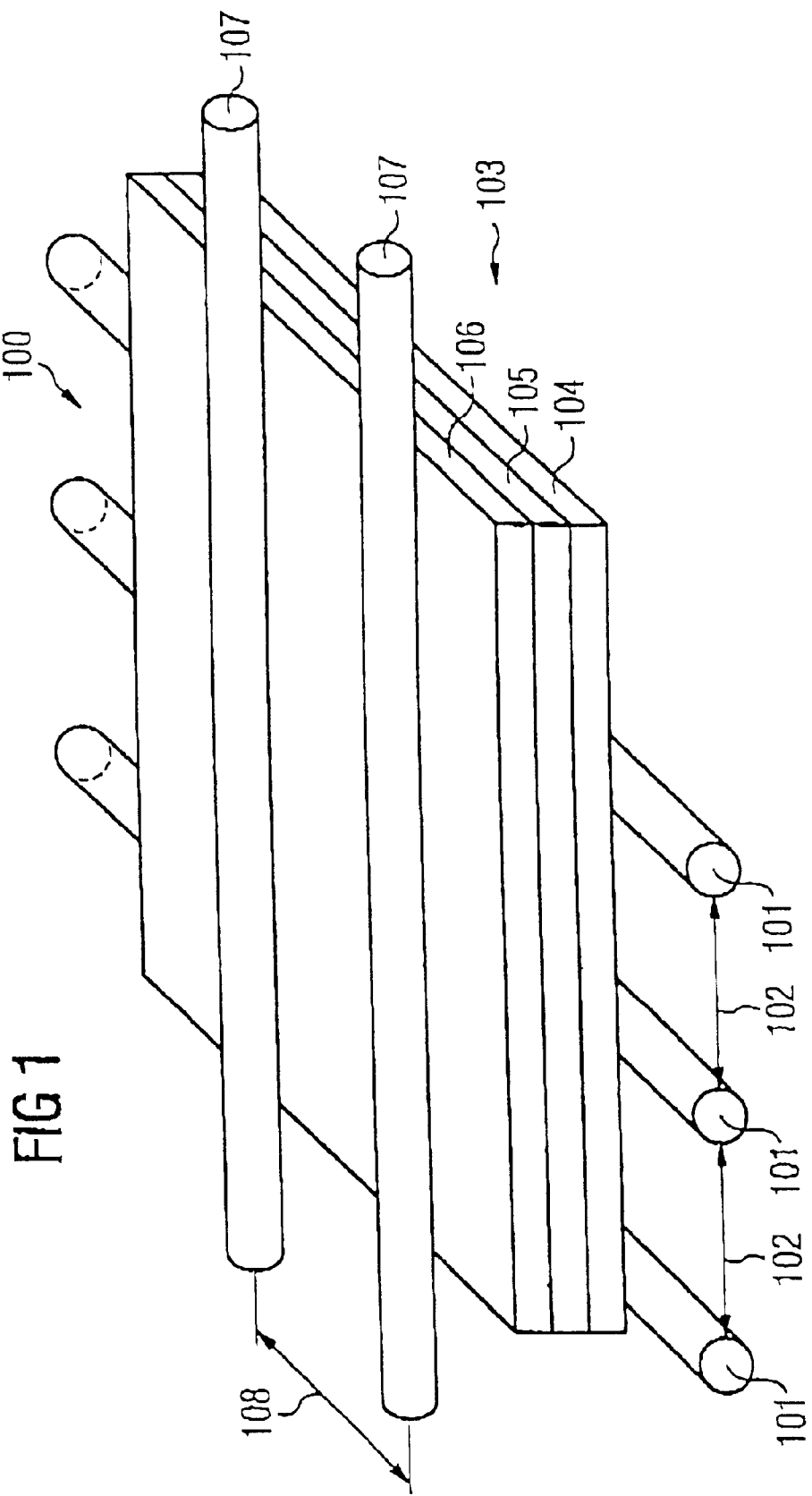

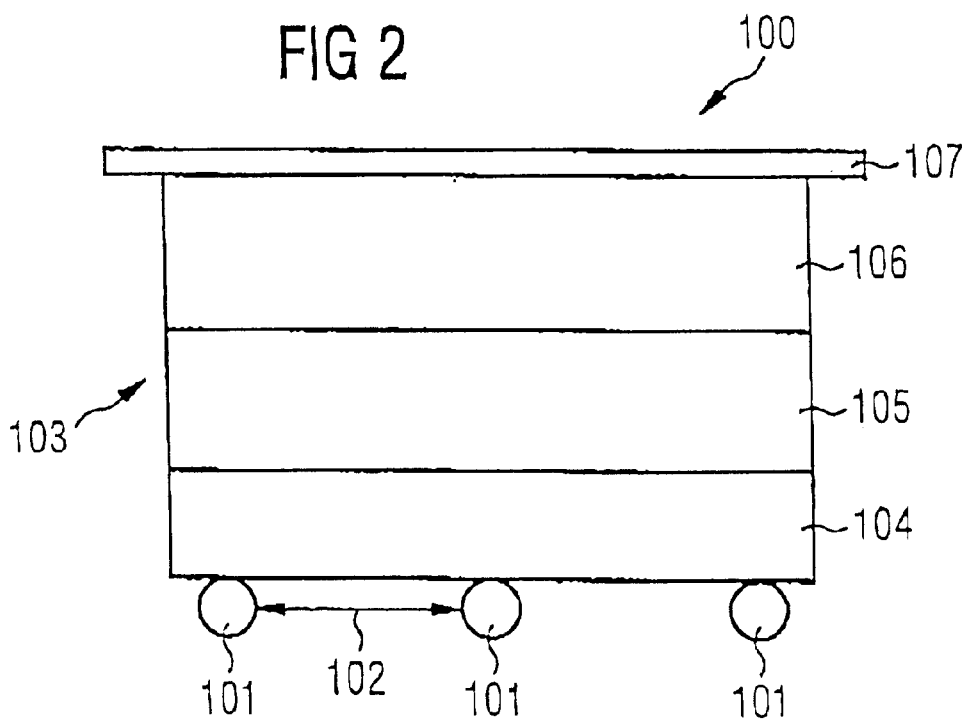
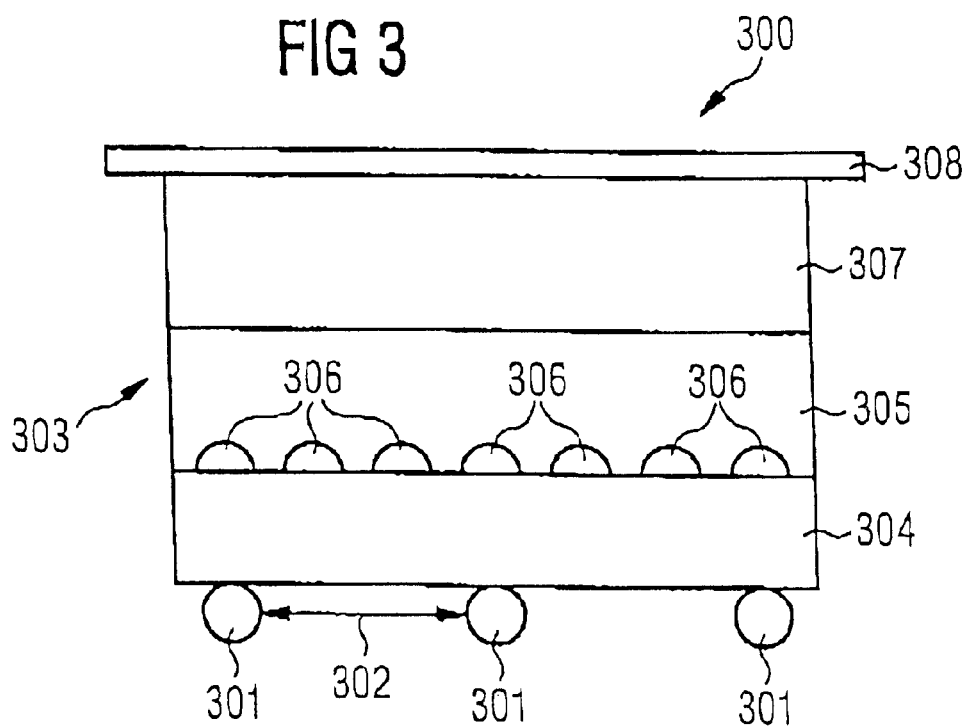

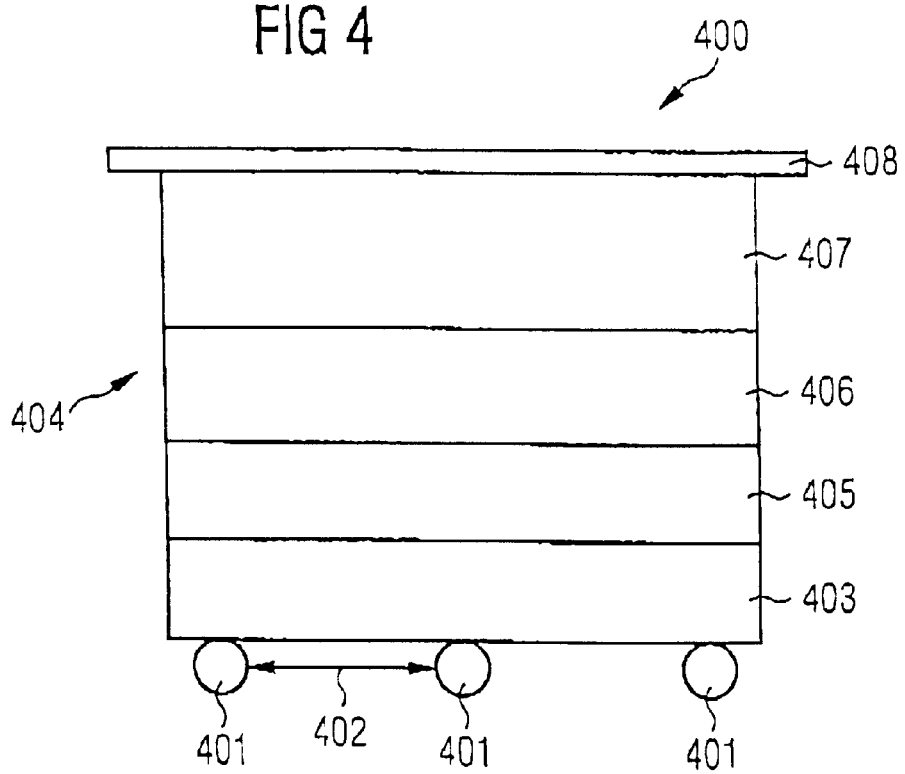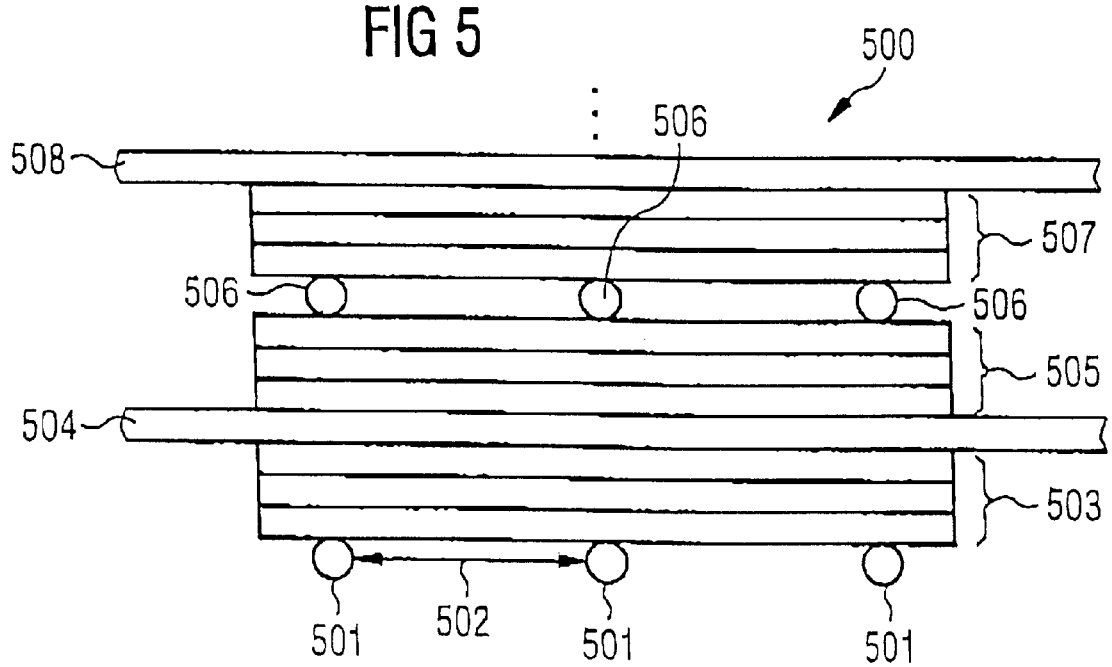

ELECTRONIC DEVICE AND METHOD FOR FABRICATING AN ELECTRONIC DEVICE

BACKGROUND OF THE INVENTION

1. Field of the Invention

The invention relates to an electronic device and a method for fabricating an electronic device.

2. Description of the Related Prior Art

[1] discloses an electronic device, a so-called flash memory. In such a flash memory, predetermined data can be stored and read out in binary form.

Furthermore, [2] discloses basic principles of so-called carbon nanotubes.

A method for fabricating carbon nanotubes by growing the carbon nanotubes on a substrate is disclosed in [3].

A further fabrication method for fabricating carbon nanotubes by depositing the carbon nanotubes from the vapour phase is described in [3].

Furthermore, [4] discloses a layer system, having a first silicon dioxide layer, a silicon nitride slayer applied thereon, and a second silicon dioxide layer applied on the silicon nitride layer. Such a layer system is also referred to as ONO layer system.

Furthermore, it is described in [4] that the silicon nitride layer has the property analogous to a floating gate, i.e. that charge carriers which have passed through the first silicon dioxide layer or through the second silicon dioxide layer into the silicon nitride layer can be stored there for a very long period of time (a number of years or longer).

Furthermore, [5] discloses forming so-called quantum dots in a layer.

[6] describes a method for storing and reading out binary data in and, respectively, from a flash memory cell. In particular, the functional principle of a NAND read-out is explained.

[7] proposes a device based on nanowires, the nanowires being arranged one above the other such that they cross one another in the device.

The invention is based on the problem of specifying an electronic device and also a method for fabricating an electronic device with which it is possible to form a memory device which, compared with the flash memory disclosed in [1] has a smaller size with the same number of memory cells.

The problem is solved by means of the electronic device and also by means of the method for fabricating an electronic device having the features according to the independent Patent claims.

An electronic device has at least one electrically conductive first nanowire and also a layer system applied on the first nanowire. At least one second nanowire is applied on the layer system, the first nanowire and the second nanowire being arranged skew with respect to one another. The layer system is configured in such a way that charge carriers generated by the first nanowire and/or the second nanowire can be stored in the layer system.

The use of carbon nanotubes, generally nanowires, makes it possible, in a very simple manner, to considerably reduce the size of the electronic memory element formed by the electronic device.

By way of example, if carbon nanotubes having a diameter of one nanometer and a length of 10 m are arranged at a distance of 20 nm from one another, the area which is required for an elementary cell array for storing a bit is reduced by the factor of 500 or more compared with the required area of the flash memory disclosed in [1].

A further considerable advantage of the invention can be seen in the fact that gate electrodes no longer have to be patterned, rather the layers of the layer system can be applied over the whole area. Consequently it is no longer necessary to pattern a floating gate with a very high spatial. resolution of a few nanometers.

The second nanowire may be configured such that it is electrically semiconducting.

The electrical memory element may have both a plurality of electrically conductive first nanowires and a plurality of second nanowires, which are in each case arranged skew with respect to one another.

According to this configuration of the invention, a memory matrix is clearly formed in a corresponding manner to that in the case of the known flash memory.

The second nanowire may be a silicon nanowire or a boron nitride nanowire. In general, the first nanowire and/or the second nanowire may contain, gold, silver, tungsten, copper, tantalum and/or titanium or any desired alloy of a plurality of the abovementioned metals, in general any electrically conductive or semiconducting material. According to a further configuration of the invention, the first nanowire and/or the second nanowire are/is one or a plurality of carbon nanotubes.

Consequently, a nanowire is to be understood hereinafter as a structure which essentially has a thickness approximately equal to the diameter of a carbon nanotube.

The layer system used may be the so-called ONO layer system, i.e. a layer system having a first silicon dioxide layer and a silicon nitride layer applied on the first silicon dioxide layer. A second silicon dioxide layer is applied on the silicon nitride layer.

The ONO layer system clearly forms a floating gate, electrical charge carriers which penetrate through the first silicon dioxide layer or the second silicon dioxide layer being stored in the silicon nitride layer.

In the event of a plurality of first and second nanowires and use of an ONO layer system, one development of the invention provides for the first nanowires and the second nanowires to be arranged in each case in such a way with respect to one another that the distance between two first nanowires or between two second nanowires is in each case at least twice as large as the distance between the second nanowires and the silicon nitride layer in the ONO layer system.

The function of a floating gate can also be realized by quantum dots being formed, in the layer system as artificial imperfections for storing electrical charge carriers. The quantum dots may contain polysilicon.

According to a further configuration of the invention, the first nanowires and/or the second nanowires have a plurality of cylindrical walls arranged concentrically around one another.

This development increases the stability of the nanowires, in particular with regard to a possible reaction with a dielectric possibly situated between the nanowires, as a result of which the reliability of the electronic device is considerably improved.

The invention can clearly be seen in the fact that each second nanowire constitutes a series circuit of transistors in which the first nanowires can clearly be used as gate electrodes. The imperfections which are formed in the layer system for the purpose of storing the charge carriers generated serve for shifting the threshold voltage of the electronic device.

In this way, two mutually differentiable states can be generated in a simple manner by the electronic device according to the invention, as a result of which the electronic device can be used as a binary memory element. These two states are characterized by a first state, in which the threshold voltage of the electronic device is not shifted, and a second state, in which the threshold voltage of the electronic device is shifted.

The functional principle of NAND read-out as described in [6] can be used for storing and for reading out the data. The metallic top electrodes which may be provided on the nanowires are used both for charging the imperfections, i.e. writing at high voltage, and directly during the reading of the data, the regions that are not to be read out being switched through by field effects.

The electronic device presented above can be fabricated by a plurality of electrically conductive first nanowires being arranged next to one another. At least one layer system is applied on the first nanowires. Furthermore, on the layer system, a plurality of second nanowires is arranged next to one another and skew with respect to the first nanowires.

The layer system can, for example, be fabricated by a silicon dioxide layer being applied on the first nanowires, for example by means of a CVD method (chemical vapour deposition method), a sputtering method, or a vapour deposition method. According to this configuration, a silicon nitride layer is applied on the silicon dioxide layer, once again for example by means of a CVD method, a sputtering method, or a vapour deposition method.

A second silicon dioxide layer is applied on the silicon nitride layer, for example in the same way as the first silicon dioxide layer.

In addition, at the beginning of the method, a further silicon nitride layer may be applied on the first nanowires, in particular for the purpose of protecting the nanowires against thermal influences, in particular also against their destruction in the context of a CVD method or of another method in which the nanowires are exposed to an elevated temperature.

The nanowires can be fabricated in various ways, for example by means of a deposition method from the vapour phase (Chemical Vapour Deposition Method, CVD Method), as is described e.g. in [3], or else in the electric arc process or by means of laser ablation.

BRIEF SUMMARY OF THE INVENTION

The nanowires made of a metal can be fabricated by means of known methods, for example by means of a CVD method, a sputtering method or a vapour deposition method.

The nanowires, in particular the carbon nanotubes, can be arranged and oriented in the desired manner for example using one or more electric fields.

As an alternative, their arrangements, or the orientation of the nanowires, can also be effected by mechanical action, for example by shaking or specific arrangement and orientation of the nanowires.

Furthermore, according to an alternative configuration of the invention, so-called nano-pores can be used for arranging the nanowires, in particular for arranging the carbon nanotubes.

As an alternative, just like the arrangement of the second nanotubes, the arrangement of the first nanotubes can be effected in a known manner using a scanning force microscope.

Furthermore, it is possible for a plurality of layer systems to be arranged one above the other in the form of a stack, one or a plurality of first nanowires and one or a plurality of second nanowires being arranged alternately in each case between two layer systems. A further reduction in the requisite space requirement is achieved in this way since clearly in each case only one layer of first nanowires is necessary for controlling layers with second nanowires.

The above-described stacking of the layer systems makes it possible to achieve a further doubling of the storage capacity with the required memory area remaining the same.

Exemplary embodiments of the invention are illustrated in the figures and are explained in more detail below.

BRIEF DESCRIPTION OF THE DRAWINGS

In the figures:

FIG. 1 shows a plan view of an electronic device according to a first exemplary embodiment of the invention obliquely from above;

FIG. 2 shows a cross section through an electronic device according to a first exemplary embodiment of the invention;

FIG. 3 shows a cross section through an electronic device according to a second exemplary embodiment of the invention;

FIG. 4 shows a cross section through an electronic device according to a third exemplary embodiment of the invention;

FIG. 5 shows a cross section through an electronic device according to a fourth exemplary embodiment of the invention;

FIG. 1 shows an electronic device 100 according to a first exemplary embodiment of the invention.

DETAILED DESCRIPTION OF THE INVENTION

The electronic device 100, an electronic memory in accordance with the first exemplary embodiment, has first electrically semiconducting carbon nanotubes 101. The first carbon nanotubes 101 are fabricated by means of a deposition method from the vapour phase, as is described in [3].

The fabricated, semiconducting first carbon nanotubes 101 are selected and the selected first carbon nanotubes, which have been determined as electrically semiconducting carbon nanotubes, are arranged at a predetermined distance 102 from one another on an essentially planar surface, for example a substrate (not illustrated).

The distance between two semiconducting carbon nanotubes 101, which serve as first nanowires, is arranged to be at least 5 nm to 7 nm.

The arrangement of the first carbon nanotubes 101 and their essentially parallel orientation with respect to one another are achieved by the use, i.e. application, of an electric field with which the first carbon nanotubes 101 are oriented.

It should be noted in this connection that the carbon nanotubes do not necessarily have to be oriented parallel to one another; it is important only that the first carbon nanotubes 101 do not intersect one another in the electronic device 100.

A layer system 103 is applied on the first carbon nanotubes 101.

The layer system 103 is an ONO layer system, i.e. it has a first silicon dioxide layer 104, a silicon nitride layer 105 applied thereon, and a second silicon dioxide layer 106 applied on the silicon nitride layer 105.

The ONO layer system is fabricated by a first silicon dioxide layer 104 being applied on the first carbon nanotubes 101, by means of a sputtering method in accordance with this exemplary embodiment. The thickness of the first silicon dioxide layer 104 is 2.4 nm to 3.5 nm.

A silicon nitride layer 105 having a thickness of 4 nm is deposited on the first silicon dioxide layer 104 by means of a CVD method at a temperature of 700° C.

In a further step, a second silicon dioxide layer having a thickness of approximately 4.5 nm is applied on the silicon nitride layer 105 by means of a wet oxidation taking place at 900° C.

Second, electrically metallically conductive carbon nanotubes 107 are arranged on the second silicon dioxide layer 106.

The second carbon nanotubes 107 are likewise deposited from the vapour phase, as described in [3], by means of a suitable CVD method. From the deposited carbon nanotubes, the metallically conductive, second carbon nanotubes 107 are selected and applied to the second silicon dioxide layer 106 and oriented by means of an electric field in a predetermined manner.

Each first, electrically semiconducting carbon nanotube 101 clearly constitutes a series circuit of transistors which are controlled by the metallically conductive, second carbon nanotubes 107 as gate electrodes.

Imperfections in the silicon nitride layer 105 clearly form a floating gate, as a result of which, when the imperfections are occupied by electrical charge carriers, the threshold voltage of the electrical device 100, i.e. in particular of the region in which the imperfections are situated in particular, is shifted.

In this way, the electronic device 100 forms a binary permanent memory since, by application of a write voltage by means of a peripheral circuit (not illustrated), which write voltage is greater than the operating voltage, between a first carbon nanotube 101 and a second carbon nanotube 107, electrical charge carriers are injected into the silicon nitride layer 105 and stored, i.e. held there.

The functional principle of NAND read-out as described in [6] is used for writing and reading out the binary data.

In this case, the metallic top electrodes which are provided on the nanowires are used both for charging the imperfections, i.e. writing at high voltage, and directly for reading the data, the regions that are not to be read out being switched through by a field effect that occurs and is utilized according to the invention.

During this "writing operation", the further semiconducting first carbon nanotubes 101 are connected to a predetermined reference voltage, so that the voltage drop required for injecting the electrical charge carriers into the silicon nitride layer 105 is present only across the crossover point between the first carbon nanotube 101 and the second carbon nanotube 107, which lie above one another at the respective crossover point.

If the injected electrical charge carriers are intended to be erased again from the silicon nitride layer at the corresponding crossover point, then this is possible by applying the electric voltage, the polarity of which has been correspondingly reversed, between the respective first carbon nanotube 101 and the respective second carbon nanotube 107.

If the state of a memory cell defined by a respective crossover point between a first carbon nanotube and a second carbon nanotube 107 is then intended to be determined, i.e. read out, a check is made to see whether the imperfections in the silicon nitride layer 105 between the crossover point of the first carbon nanotube 101 and the second carbon nanotube 107 are occupied by electrical charge carriers, as a result of which the transistor threshold voltage would be shifted.

The driving and the read-out of the individual memory cells, which is formed by the crossover point between the first carbon nanotubes 101, the second carbon nanotubes 105 and the intervening ONO layers 103, ensues by means of customary CMOS circuit technology (not explained in detail here) in the manner described in [6].

In order to avoid an overlap of the electric fields between the carbon nanotubes 101, 107, the distance 102 between the first carbon nanotubes 101 and the distance 108 between the second carbon nanotubes 107 is at least 5 nm, i.e. the distance between the nanotubes 107, 108 is twice as large as the distance between the first carbon nanotubes 101 and the lower surface of the silicon nitride layer 105.

FIG. 2 shows a cross section through the electronic device 100 according to the first exemplary embodiment, the same elements in FIG. 1 and FIG. 2 being provided with the same reference symbols.

FIG. 3 illustrates a cross section through an electronic device 300 according to a second exemplary embodiment.

The first carbon nanotubes 301 are arranged essentially parallel to one another at a distance 302 of at least 5 nm.

A further layer system, according to this exemplary embodiment a layer system 303 having a first silicon dioxide layer 304 and a second silicon dioxide layer 305, is provided on the first carbon nanotubes 301, polysilicon dots 306 being formed in the second silicon dioxide layer 305 as artificial imperfections in which electrical charge carriers generated by the first carbon nanotubes 301 and/or the second carbon nanotubes 308 can be stored.

A third silicon dioxide layer 307 is applied on the second silicon dioxide layer 305.

The individual silicon dioxide layers 304, 305, 307 can be applied by means of a CVD method, by means of a sputtering method or by means of a vapour deposition method.

The second carbon nanotubes 308 are applied on the third silicon dioxide layer 307 in accordance with the same procedure as in the first exemplary embodiment.

The electronic device 300 thus clearly differs from the electronic device 100 according to the first exemplary embodiment in that the layer system 303 used is not an ONO layer system but rather a layer system in which polysilicon dots are provided for holding, i.e. storing, electrical charge carriers.

In order, during the application of the layer system 303, to avoid damage possibly occurring to the first carbon nanotubes 401 on account of high temperatures during the fabrication method, provision is made according to a third exemplary embodiment (cf. FIG. 4) for a further silicon nitride layer 403, which has a thickness of 4 nm, to be applied on the first carbon nanotubes 401, which are arranged essentially parallel to one another at a distance 402 of at least 5 nm.

Applied on the further silicon nitride layer 403 is the layer system 404, according to the third exemplary embodiment once again an ONO layer system 404 having a first silicon dioxide layer 405, a silicon nitride layer 406 applied thereon, and a second silicon dioxide layer 407 applied on the silicon nitride layer 406.

The second carbon nanotubes 408 are applied on the ONO layer system 404.

An electronic device 400 in accordance with a third exemplary embodiment of the invention is formed in this way.

FIG. 5 shows an electronic device 500 in accordance with a fourth exemplary embodiment of the invention.

The electronic device 500 in accordance with the fifth exemplary embodiment essentially corresponds to the electronic device 100 in accordance with the first exemplary embodiment, with the difference that a multiplicity of ONO layer systems are provided.

The electronic device 500 thus has first carbon nanotubes 501, which are arranged essentially parallel at a distance 502 of approximately 5 nm from one another.

A first ONO layer system 503 is applied above the first carbon nanotubes 501, second carbon nanotubes 504 in turn being applied on said first ONO layer system.

A second ONO layer system 505 is applied on the second carbon nanotubes 504 and first carbon nanotubes 506 are in turn applied on the second ONO layer system 505.

A third ONO layer system 507 is applied on the first carbon nanotubes 506 and second carbon nanotubes 508 are in turn applied on said third ONO layer system.

In this way, it is clearly possible to control in each case two layers of first carbon nanotubes 506 by means of one layer of second carbon nanotubes 504, 508, as a result of which the requisite memory space requirement of the electronic device 500 is only half as large as the memory space requirement of the electronic device 100 in accordance with the first exemplary embodiment.

The following publications are cited in this document:
[1] U. Tietze and Ch. Schenk, Halbleiterschaltungstechnik, [Semiconductor circuitry], Springer Verlag, 11th edition. ISBN 3-540-64192-0, pp. 751–752, 1999.
[2] T. Dekker, Carbon-Nanotubes as Molecular Quantum Wires, Physics Today, pp. 22–28, May 1999.
[3] Young Sang Suh and Yin Seong Lee, Highly-Ordered Two-Dimensional Carbon-Nanotubes Areas, Applied Physics Letters, Volume 75, No. 14, pp. 2047–2049, October 1991.
[4] D. Widmann, H. Mader, H. Friedrich, Technologie hochintegrierter Schaltungen, [Technology of Large Scale Integrated Circuits], 2nd edition, Springer Verlag, ISBN 3540-59357-8, pp. 72–75, 1996.
[5] Ilgweon Kim et al, Room Temperature Single Electron Effects in Si Quantum Dot Memory with Oxide-Nitride Tunneling Dielectrics, IEDM 98, pp. 111–114, 1998.
[6] S. Aritome et al, Reliability Issues of Flash Memory Cells, Proceedings of the IEEE, Vol. 81, No. 5, pp. 776–788, May 1993.
[7] WO 01/03208 A1

List of Reference Symbols
100 Electronic device
101 First carbon nanotube
102 Distance between two first carbon nanotubes
103 Layer system
104 First silicon dioxide layer
105 Silicon nitride layer
106 Second silicon dioxide layer
107 Second carbon nanotube
108 Distance between two second carbon nanotubes
300 Electronic device
301 First carbon nanotube
302 Distance between two first carbon nanotubes
303 Layer system
304 First silicon dioxide layer
305 Second silicon dioxide layer
306 Polysilicon quantum dots
307 Third silicon dioxide layer
308 Second carbon nanotube
400 Electronic device
401 First carbon nanotube
402 Distance between two first carbon nanotubes
403 Further silicon nitride layer
404 Layer system
405 First silicon dioxide layer
406 Silicon nitride layer
407 Second silicon dioxide layer
408 Second carbon nanotube
500 Electronic device
501 First carbon nanotube
502 Distance between two first carbon nanotubes
503 First layer system
504 Second carbon nanotube
505 Second layer system
506 First carbon nanotube
507 Third layer system
508 Second carbon nanotube

What is claimed is:

1. Electronic Device having at least one electrically conductive first nanowire; at least one layer system applied on the first nanowire; at least one second nanowire applied on the layer system; the first nanowire and the second nanowire being arranged skew with respect to one another; and the layer system being configured in such a way that charge carriers generated by the first nanowire and/or the second nanowire can be stored in the layer system.

2. Electronic device according to claim 1, in which the second nanowire is configured such that it is electrically semiconducting.

3. Electronic device according to claim 1, having a plurality of electrically conductive first nanowires; and having a plurality of second nanowires; the first nanowires and the second nanowires in each case being arranged skew with respect to one another.

4. Electronic device according to claim 1, in which the second nanowire is a silicon nanowire or a boron nitride nanowire.

5. Electronic device according to claim 1, in which the first nanowire and/or the second nanowire are/is one or a plurality of carbon nanotubes.

6. Electronic device according to claim 1, in which the first nanowire and the second nanowire contain material selected from the group consisting of gold, silver, tungsten, copper, tantalum, and titanium.

7. Electronic device according to claim 1, in which the layer system has a first silicon dioxide layer; a silicon nitride layer applied thereon; and a second silicon dioxide layer.

8. Electronic device according to claim 7, in which a further silicon nitride layer is provided between the first nanowire and the first silicon dioxide layer.

9. Electronic device according to claim 7, in which the first nanowires and the second nanowires are in each case arranged in such a way with respect to one another that the distance between two first nanowires or between two second nanowires is in each case at least twice as large as the distance between the first nanowires and the silicon nitride layer.

10. Electronic device according to claim 1, in which the layer system has quantum dots as imperfections for storing electrical charge carriers.

11. Electronic device according to claim 10, in which the quantum dots contain polysilicon.

12. Electronic device according to claim 1, in which the first nanowires and/or the second nanowires have a plurality of cylindrical walls.

13. Electronic device according to claim 1, having a plurality of layer systems arranged one above the other, a first nanowire and a second nanowire being arranged alternately in each case between two layer systems.

14. Method for fabricating an electronic device, comprising: arranging a plurality of electrically conductive first nanowires next to one another; applying at least one layer system on the first nanowires; and arranging, on the layer system, a plurality of second nanowires next to one another and skew with respect to the first nanowires.

15. Method according to claim 14, in which the step of applying the layer system has the following steps: Applying a first silicon oxide layer; applying a silicon nitride layer on the first silicon oxide layer; applying a silicon oxide layer on the silicon nitride layer.

16. Method according to claim 15, in which, at the beginning of the application of the layer system, a further silicon nitride layer is applied.

17. Method according to claim 14, in which the first nanowires and/or the second nanowires are deposited from the vapour phase.

18. Method according to claim 14, in which an electric field is used to arrange the first nanowires and/or the second nanowires.

* * * * *